United States Patent
Fan et al.

(10) Patent No.: US 11,105,567 B2
(45) Date of Patent: Aug. 31, 2021

(54) THERMAL MANAGEMENT ASSEMBLY COMPRISING BULK GRAPHENE MATERIAL

(71) Applicant: Momentive Performance Materials Quartz, Inc., Strongsville, OH (US)

(72) Inventors: Wei Fan, Strongsville, OH (US); Xiang Liu, Medina, OH (US); John Mariner, Avon Lake, OH (US); Aaron Rape, North Royalton, OH (US)

(73) Assignee: Momentive Performance Materials Quartz, Inc., Strongsville, OH (US)

( * ) Notice: Subject to any disclaimer, the term of this patent is extended or adjusted under 35 U.S.C. 154(b) by 449 days.

(21) Appl. No.: 14/431,123

(22) PCT Filed: Sep. 24, 2013

(86) PCT No.: PCT/US2013/061335
§ 371 (c)(1),
(2) Date: Mar. 25, 2015

(87) PCT Pub. No.: WO2014/052282
PCT Pub. Date: Apr. 3, 2014

(65) Prior Publication Data
US 2015/0253089 A1  Sep. 10, 2015

Related U.S. Application Data

(60) Provisional application No. 61/705,362, filed on Sep. 25, 2012.

(51) Int. Cl.
*B32B 9/00* (2006.01)
*F28F 21/02* (2006.01)
(Continued)

(52) U.S. Cl.
CPC .............. *F28F 21/02* (2013.01); *B32B 15/04* (2013.01); *F28F 21/089* (2013.01);
(Continued)

(58) Field of Classification Search
CPC ... Y10T 428/30; C01B 31/04; C01B 31/0423; C01B 31/0206; C01B 31/0438; B82Y 30/00; B32B 9/007
(Continued)

(56) References Cited

U.S. PATENT DOCUMENTS 4,104,417 A * 8/1978 Sara .................. C04B 41/52
427/113
4,990,402 A * 2/1991 Kneringer ................ B23K 1/19
228/122.1
(Continued)

FOREIGN PATENT DOCUMENTS

EP  0403208  12/1990
JP  2005159318  6/2005
(Continued)

OTHER PUBLICATIONS

ISA/US, International Search Report and Written Opinion prepared for International Application No. PCT/US13/61335, dated Feb. 7, 2014.

*Primary Examiner* — Daniel H Miller
(74) *Attorney, Agent, or Firm* — McDonald Hopkins LLC

(57) ABSTRACT

A thermal management assembly comprising a bulk graphene material and a metal-based coating layer disposed on opposing surfaces of the bulk graphene core material comprising an agent that is reactive with the graphene to form a carbide. The metal-based coating layer can serve as an outer layer of the assembly or can serve to bond the graphene to other materials encapsulating the graphene core. The metal-based coating layer with the reactive agent provides an
(Continued)

assembly exhibiting excellent thermal conductivity properties and greatly improved thermal interface resistance.

19 Claims, 4 Drawing Sheets

(51) Int. Cl.
| | |
|---|---|
| H01L 23/373 | (2006.01) |
| B32B 15/04 | (2006.01) |
| H05K 3/46 | (2006.01) |
| H05K 1/02 | (2006.01) |
| F28F 21/08 | (2006.01) |
| H05K 3/00 | (2006.01) |
| B82Y 30/00 | (2011.01) |

(52) U.S. Cl.
CPC ........ *H01L 23/373* (2013.01); *H01L 23/3731* (2013.01); *H01L 23/3735* (2013.01); *H01L 23/3736* (2013.01); *H05K 1/0209* (2013.01); *H05K 3/4602* (2013.01); *B32B 2307/302* (2013.01); *B82Y 30/00* (2013.01); *H01L 2924/0002* (2013.01); *H05K 3/0061* (2013.01); *H05K 2201/0323* (2013.01); *Y10T 428/30* (2015.01)

(58) Field of Classification Search
USPC .......................... 428/408; 423/448; 165/185
See application file for complete search history.

(56) References Cited

U.S. PATENT DOCUMENTS

| | | | |
|---|---|---|---|
| 5,195,021 | A | 3/1993 | Ozmat |
| 5,296,310 | A | 3/1994 | Kibler |
| 5,494,753 | A * | 2/1996 | Anthony ............... H01L 23/373 |
| | | | 156/304.1 |
| 5,958,572 | A | 9/1999 | Schmidt |
| 6,131,651 | A | 10/2000 | Richey |
| 6,215,661 | B1 | 4/2001 | Messenger |
| 6,661,317 | B2 | 12/2003 | Ali |
| 7,670,681 | B2 * | 3/2010 | Schedler .................. C22C 9/00 |
| | | | 165/168 |
| 2005/0064230 | A1 | 3/2005 | Sayir |
| 2007/0053168 | A1 | 3/2007 | Sayir |
| 2007/0289730 | A1 | 12/2007 | Wu |
| 2010/0326645 | A1 | 12/2010 | Fan |
| 2012/0234524 | A1 | 9/2012 | Fan |

FOREIGN PATENT DOCUMENTS

| | | |
|---|---|---|
| JP | 2006196593 | 7/2006 |
| JP | 2011023670 | 2/2011 |
| JP | 2012-238733 A | 6/2012 |
| WO | 2005/048298 | 5/2005 |
| WO | WO2012/125817 | 9/2012 |

\* cited by examiner

THERMAL MANAGEMENT ASSEMBLY COMPRISING BULK GRAPHENE MATERIAL

REFERENCE TO RELATED APPLICATIONS

This application is a 35 U.S.C. 371 national stage filing and claims priority to PCT Application No. PCT/US2013/061335, entitled "Thermal Management Assembly Comprising Bulk Graphene Material" filed on Sep. 24, 2013, which claims priority to U.S. Provisional Application No. 61/705,362 entitled "Thermal Management Assembly Comprising Bulk Graphene Material" filed on Sep. 25, 2012, which are incorporated by reference herein in their entirety.

FIELD

The present invention relates to a thermal management assembly that can be used to transfer heat away from a heat source; an assembly having the thermal management assembly in contact with the heat source; and methods of manufacturing such assemblies. In particular, the present invention relates to a thermal management assembly comprising bulk graphene materials.

BACKGROUND

New electronic devices are constantly becoming more powerful and more compact. High power components, including RF/microwave electronics, diode laser, light emitting diode (LED), insulated gate bipolar transistors (IGBT), central processing units (CPU), etc., are utilized in a wide variety of industries such as telecommunications, automotive, aerospace, avionics, medical, and materials processing. With these smaller more powerful devices comes an increased requirement to dissipate the heat generated by the devices. The electronics can be damaged by temperature buildup if heat generated during operation is not sufficiently or effectively dissipated. New capabilities are constrained by the ability of designers to remove heat in a cost-effective manner. Generally, every 10° C. increase in chip junction temperature cuts the life of the device in half.

Conventional thermal management products are typically constructed of either copper (Cu) or aluminum (Al). But good thermal management and heat dissipation requires that the semiconductor die is bonded directly to the heat spreader, and conventional materials do not match the coefficient of thermal expansion of semiconductors. When directly bonded for optimum thermal management, thermal stress can impact the life of the assembly. Low coefficient of thermal expansion materials such as tungsten copper (WCu), molybdenum copper (MoCu), and aluminum silicon carbide (AlSiC) were developed to reduce the thermal stress between heat spreader and semiconductor die. To achieve necessary dielectric performance, aluminum nitride (AlN) and beryllium oxide (BeO) are also common choices as substrate materials for microelectronics.

Other materials and designs have been disclosed for the management and removal of heat from electronic devices using bulk graphene materials. U.S. Pat. No. 5,296,310 discloses a hybrid structural device of a high thermal conductivity material sandwiched between a pair of face sheets comprising a metal or matrix-reinforced metal. The core material can be a highly oriented pyrolytic graphite (HOPG), compression annealed pyrolytic graphite (CAPG), synthetic diamond, composites using these materials, or the like. U.S. Pat. No. 6,215,661 discloses a heat spreader comprising an L-shaped plate of thermal pyrolytic graphite encapsulated in aluminum. U.S. Pat. No. 5,958,572 discloses a heat spreading substrate comprising an insert of thermal pyrolytic graphite ("TPG"), a diamond like-carbon, or other similar material having a plurality of vias formed within to optimize heat flow transfer through the plurality of vias.

Thermal pyrolytic graphite (TPG), with its metal encapsulated composites (e.g., TC1050® available from Momentive Performance Materials), is an advanced thermal management material serving military and aerospace industries for over a decade. TPG is formed via a two-step process that provides well-aligned graphene planes to provide a material with superior thermal conductivity (e.g., greater than 1500 W/m-K). Compared to copper, which is commonly used in passive cooling and most thermal conductive among all the materials mentioned above, TPG can provide four times the cooling power at ¼th the weight of copper.

Bulk graphene material, including the above described materials, is a relatively soft material, due to its weak Van de Waals force between the graphene layers. Traditionally, heat spreaders comprising bulk graphene are formed by encapsulating bulk graphene into a metal casing, such as aluminum, copper, etc. via a diffusion bonding process. Such a process is described in U.S. Pat. No. 6,661,317. The encapsulated bulk graphene composite parts behave like solid metal and can be further machined, plated, or bonded to other components to meet various customers' requirement. A typical manufacturing process is illustrated in FIGS. 1A-1C. A bulk graphene-metal composite 100 can be formed by (A) disposing a bulk graphene core 112 between metal face sheets 110a and 110b, (B) subjecting the assemble to a diffusion bonding process; and (C) machining the composite to provide a structure of a desired shape.

Encapsulated bulk graphene composites, such as cold plates, heat spreaders, thermal straps, etc., can quickly conduct the heat away from the heat source and, greatly increase the electronic device's efficiency and life. Over the years, bulk graphene-metal composites have been successfully implemented into the cooling systems in satellites, avionics, and phased array radars, which can take full advantage of its high thermal performance, high durability, and light weight.

However, the interdiffusion between aluminum/copper and bulk graphene requires high temperature and high pressure, which makes the diffusion bonding process quite complex and extremely expensive. It becomes more challenging when high melting temperature alloys, such as tungsten and molybdenum, are used for encapsulation. The stiffness, brittleness of ceramics substrates and extremely high temperature stability of ceramics makes the bonding of ceramics with bulk graphene directly under heat and pressure an especially challenging process, which essentially eliminates it as an option to form such structures. These limitations of diffusion bonding hinder the development of bulk graphene composites.

SUMMARY

The present invention provides a thermal management assembly comprising a metal-based thermal bond disposed between a bulk graphene core material and a surrounding metal or ceramic substrate. The metal-based interlayer comprises a material that is reactive with the graphene to form a carbide. The metal-based interlayer provides an interface with the bulk graphene core that allows for excellent thermal conductivity and low thermal resistance.

In one aspect, the present invention provides a thermal management assembly that exhibits low thermal interface resistance. The present invention can even provide a thermal interface that is orders of magnitude lower than conventional thermal interface assemblies.

In one aspect, the present invention provides a thermal management assembly comprising a first substrate; a second substrate; a bulk graphene material disposed between the first and second substrates; and a thermal bond disposed between (a) a first surface of the bulk graphene layer and the first substrate, and (b) a second surface of the bulk graphene layer and the second substrate, the thermal bonds comprising a metal-based material comprising an agent that is reactive with the graphene to form a carbide.

In still another aspect, the present invention provides a thermal management assembly comprising a bulk graphene core material having a first surface and a second surface opposite the first surface; a first outer layer disposed on the first surface of the core material; and a second outer layer disposed on the second surface of the core material; wherein the first outer layer and the second outer layer are independently formed from a metal-based material comprising an agent that is reactive with graphene to form a carbide.

The thermal management assembly can have a thermal interface resistance of less than $10 \times 10^{-6}$ K-m$^2$/W; less than $8 \times 10^{-6}$ K-m$^2$/W; less than $5 \times 10^{-6}$ K-m$^2$/W; less than $2 \times 10^{-6}$ K-m$^2$/W; less than $1 \times 10^{-6}$ K-m$^2$/W; less than $0.5 \times 10^{-6}$ K-m$^2$/W; even less than $0.1 \times 10^{-6}$ K-m$^2$/W.

DETAILED DESCRIPTION

The present invention provides a thermal management assembly comprising a bulk graphene core material and a metal-based coating layer disposed on surfaces of the graphene layer. The metal-based coating comprises a material that is reactive with graphene to form a carbide. The metal-based coating provides an interface with the bulk graphene core that allows for excellent thermal conductivity and low thermal resistance. The thermal management assembly can comprise a structure comprising a bulk graphene core having the metal-based coating layer disposed on the surfaces of the bulk graphene material. In one embodiment, a thermal management assembly comprises the metal-based coating disposed between a bulk graphene core material and outer metal or ceramic substrates.

As used herein, the term "thermal management assembly" refers to a thermal management device or a heat transfer device comprising a high thermal conductivity material for dissipating or removing heat from a heat source. A thermal management assembly can include, but is not limited to, heat spreaders, heat sinks, cold plates, etc.

The metal-based coating layer comprising a material that is reactive with graphene to form a carbide may also be referred to herein as a "thermal bond layer." Depending on the structure, the metal-based coating layer can also be referred to as an interlayer disposed between a surface of the graphene core material and a substrate.

Figure 1A:
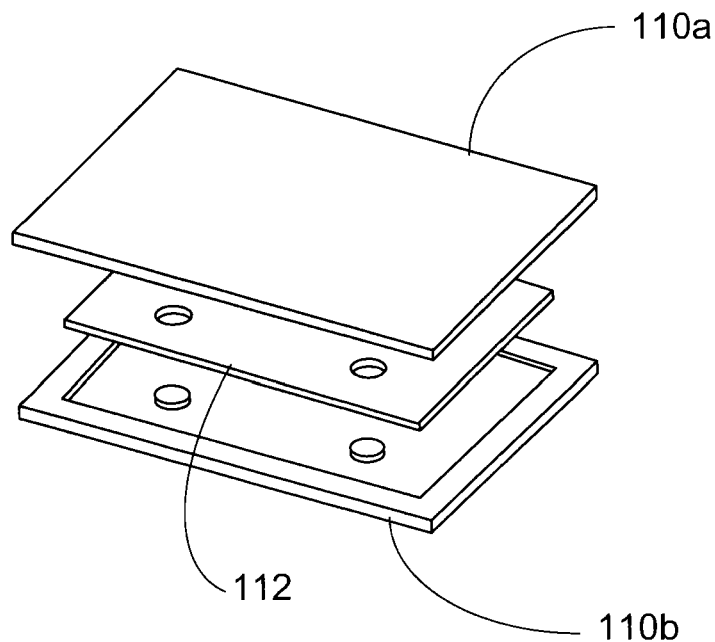
FIGS. 1A-1C illustrates a heat spreader comprising bulk graphene encapsulated by metal via a diffusion bonding process.
Figure 1B:
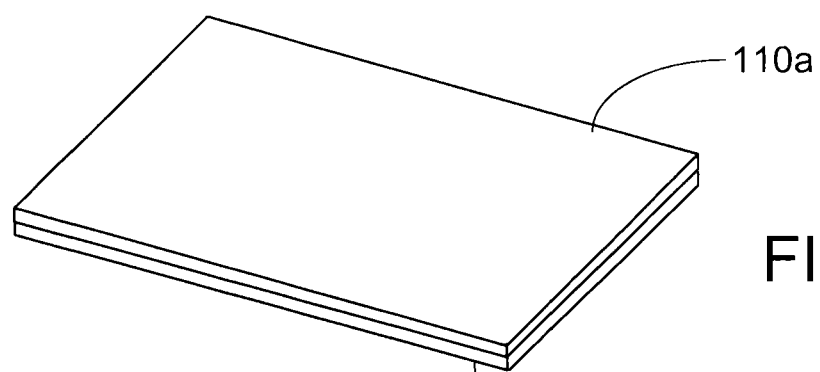
Figure 1C:
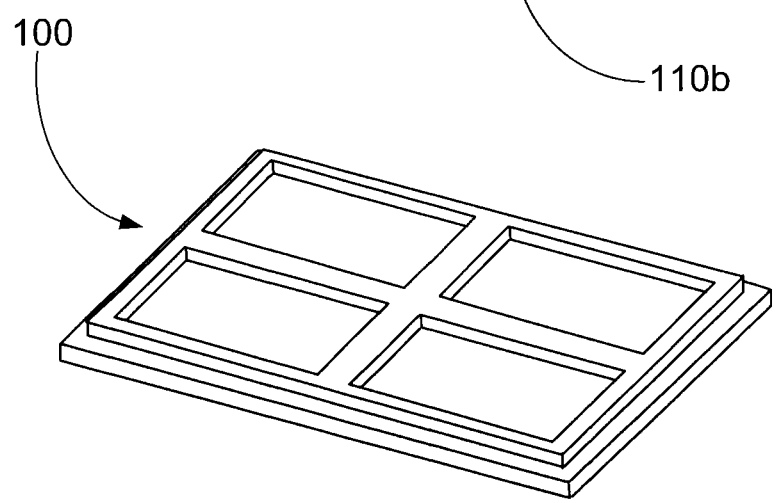
Figure 2:
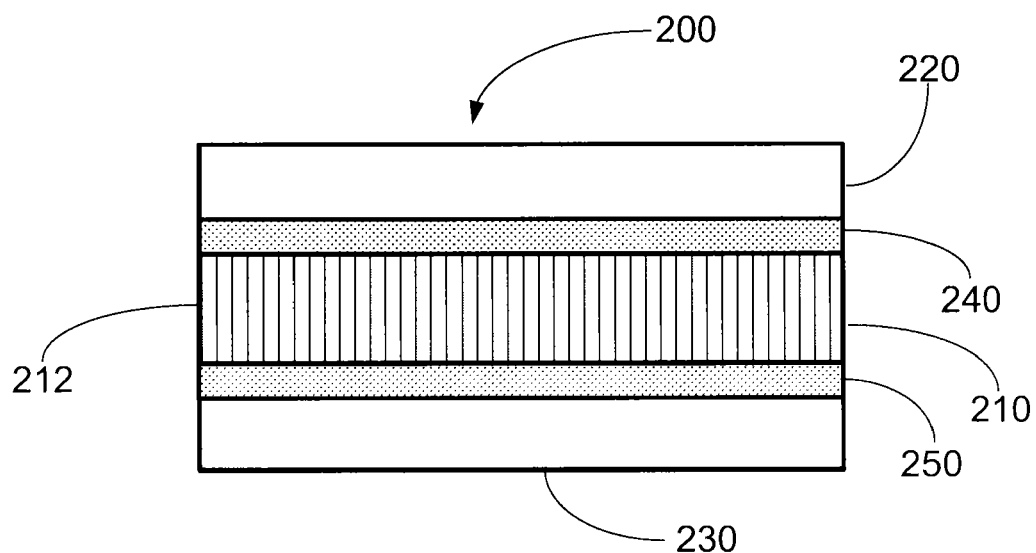
FIG. 2 is a cross-sectional view of a thermal management assembly in accordance with an embodiment of the present invention.

FIG. 2 illustrates an embodiment of a thermal management assembly in accordance with aspects and embodiments of the invention. Thermal management assembly 200 comprises a bulk graphene core 210 disposed between substrates 220 and 230. The thermal management assembly 200 comprises thermal bond layers 240 and 250 disposed at the interface between the substrates and the bulk graphene core. Thermal bond layers 240 and 250 are metal-based coating interlayers comprising an additive or agent that can react with graphene to produce a carbide surface. In the embodiment of FIG. 2, the layers 240 and 250 are also referred to as "interlayers", "interface layers" or "filler".

The bulk graphene core can be formed from a plurality of graphene layers being parallel to each other of at most 1 degree per mm in thickness. As used herein, the term "bulk graphene" encompasses materials such as pyrolytic graphite ("PG"), thermal pyrolytic graphite ("TPG"), highly oriented pyrolytic graphite ("HOPG"), compression annealed pyrolytic graphite ("CAPG"), etc. In one embodiment, bulk graphene may also refer to graphite materials consisting of crystallites of considerable size, the crystallites being highly aligned or oriented with respect to each other and having well ordered carbon layers or a high degree of preferred crystallite orientation. Bulk graphene material mostly comprises carbon atoms arranged in hexagonal patterns within each plane. In one embodiment, the bulk graphene material comprises at least 3000 graphene layers, the graphene layers being parallel to each other at an angle of at most 1 degree per mm in thickness. In one embodiment, the graphene layers are at an angle between 0.001 degree and 1 degree per mm in thickness. The thickness of the bulk graphene is more than 1 um and size at least 1 mm×1 mm. It exhibits high thermal conductivity, usually higher than 1000 W/m-K. In one embodiment, the bulk graphene has an in-plane (a-b direction) thermal conductivity greater than 1000 W/m-K; greater than 1100 W/m-K; greater than 1200 W/m-K; even greater than 1500 W/m-K. In one embodiment, the bulk graphene has a thermal conductivity of from about 1000 W/m-K to about 1800 W/m-K; from about 1100 W/m-K to about 1700 W/m-K; even from about 1200 W/m-K to about 1500 W/m-K. The bulk graphene and thermal management assembly can also exhibit excellent through-plane thermal conductivity. In one embodiment, the bulk graphene and/or thermal management assembly has a through-plane thermal conductivity of from about 200 W/m-K to about 1200 W/m-K; from about 400 W/m-K to about 1000 W/m-K; even from about 500 W/m-K to about 800 W/m-K. Here as elsewhere in the specification and claims, numerical values can be combined to form new and non-disclosed ranges.

The bulk graphene can be provided in any suitable form. In one embodiment, the bulk graphene is provided as a sheet. The bulk graphene core can have any size or thickness as desired for a particular purpose or intended use. In one embodiment, the core can have a thickness of from about 0.001 mm to about 1 mm, 1 mm to about 5 mm; from about 1.5 mm to about 4 mm; even from about 2 to about 3 mm. In one embodiment, the core layer can have a thickness of from about 25% to about 95% of the total thickness of the thermal management assembly; from about 35% to about 90% of the total thickness of the thermal management assembly; from about 40% to about 80% of the total thickness of the thermal management assembly; even from about 50% to about 75% of the total thickness of the thermal management assembly. Here as elsewhere in the specification and claims, numerical values can be combined to form new and non-disclosed ranges.

The core can be configured as desired for a particular purpose or intended application. In one embodiment, the bulk graphene core is disposed in the assembly such that graphene planes are oriented substantially parallel to the substrates. In another embodiment, the bulk graphene is disposed in the assembly such that the graphene planes are oriented perpendicular to the substrates. In FIG. 2, the graphene layers 212 are oriented perpendicular to the plane of the substrates.

In one embodiment, the bulk graphene core can be provided with vias. The loading density of the vias may range from less than 0.01% area of occupation to approximately 40% area of occupation. In another embodiment the via loading density may be from about 0.1% to about 20%. In one embodiment, the spacing of the vias may range from about 0.5 to about 125 mm. In another embodiment, the spacing of the vias may range from about 1 to about 25 mm. A bulk graphene material with vias is described in U.S. Patent Publication No. 2010/0326645, which is incorporated herein by reference in its entirety.

The substrate layers can be formed from any suitable metal or ceramic material as desired for a particular purpose or intended application. Examples of suitable metals for the substrate layer include, but are not limited to, copper, aluminum, tungsten, molybdenum, nickel, iron, tin, silver, gold, beryllium or alloys of two or more thereof. Examples of suitable ceramics include, but are not limited to, silicon nitride, silicon carbide, aluminum nitride, aluminum oxide, beryllium oxide, boron nitride, etc. The first and second substrates can be made from the same or different metal or ceramic materials. The thickness of the substrates can be selected as desired for a particular purpose or intended application. The thicknesses can be the same or different. In one embodiment, the substrates may each have a thickness of from about 2 microns to about 2 mm.

While the assembly of FIG. 2 shows substrates 220 and 230, it will be appreciated that the assembly can include one or more additional substrates overlying the substrates 220 and 230. The additional substrates can be formed from the same or different materials as substrates 220 or 230.

The thermal management assembly comprises a metal-based coating disposed on opposing surfaces of the core. The metal-based material can serve as an outer layer or a layer for bonding the core layer to the substrates. The metal-based coating layer comprises an agent that can form a carbide with graphene at a sufficiently high temperature. Generally, the metal-based coating material has a lower melting temperature than either the bulk graphene or the substrates. In one embodiment, the metal-based coating material has a thermal conductivity of about 20 W/m-K or greater. The metal-based coating material can comprise any suitable metal or alloy including, but not limited to, silver, silver-copper, tin, lead, combinations of two or more thereof, etc., that melts and bonds to the surrounding metal or ceramic substrate at an elevated temperature lower than the substrate melting temperature. The activating agent comprises a material that forms a carbide with graphene at a sufficiently high temperature. In one embodiment, the activating agent is chosen from titanium, zirconium, chromium, hafnium, aluminum, tantalum, iron, silicon, or a combination of two or more thereof. Examples of suitable metal-based coatings that can be used to bond bulk graphene to various materials include but are not limited to Al, Si, Fe, Al—Si, Fe—Si, Ag—Cu—Ti, Ti—Ni, Ni—Pd—Ti, Sn—Ti, Sn—Al, TiH$_2$, Sn—Ag—Ti, or a combination of two or more thereof. In one embodiment, the metal-based coating material has a composition different than the composition of the substrate layers.

Figure 3:
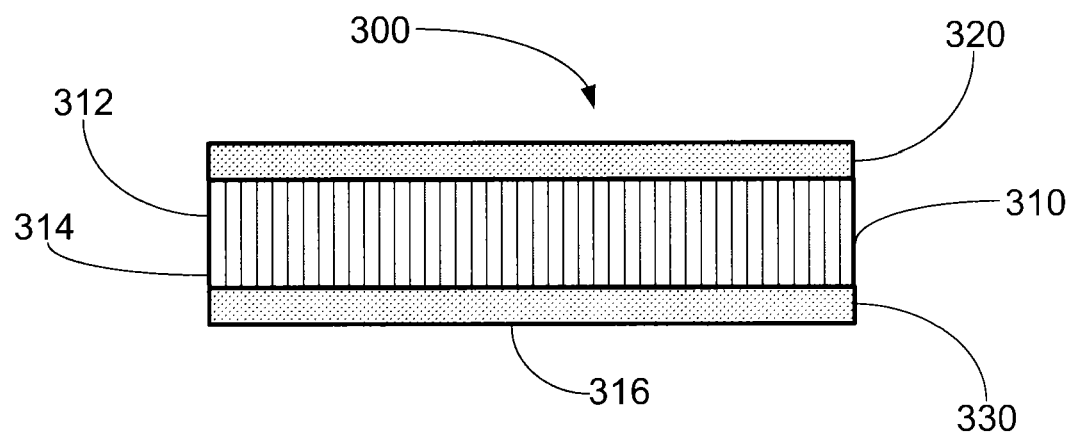
FIG. 3 is cross-sectional view of another embodiment of a thermal management assembly in accordance with aspects of the present invention.

FIG. 3 illustrates another embodiment of a thermal management assembly in accordance with aspects of the invention. In FIG. 3, thermal management assembly 300 comprises a bulk graphene core 310 having a first surface 312 and a second surface 314, a first outer layer 320 disposed on the first surface of the core, and a second outer layer 330 disposed on the second surface of the core. The core layer has the graphene layers 316 oriented perpendicular or parallel to the plane of the outer layers. The first and second outer layers are formed from a metal-based coating material. In one embodiment, the metal-based coating material can be formed from an alloy comprising an agent that is reactive with the graphene to form a carbide. In this embodiment, any of the materials that can be used as the interface material described above can be used to form the first and second outer layers.

The metal-based coating layers can have a thickness of from about 0.01 mm to about 2 mm; from about 0.02 mm to about 1 mm; even from about 0.05 mm to about 0.5 mm. Here as elsewhere in the specification and claims, numerical values can be combined to form new and non-disclosed ranges.

The assembly of FIG. 3 can be used alone as a thermal management assembly or can be further modified to include one or more substrates in the assembly. For example, in one embodiment a substrate could be disposed adjacent to the first outer layer 320. In another embodiment, the assembly 300 could be modified by providing a first substrate adjacent to the first outer layer 320, and a second substrate adjacent to outer layer 330 to provide a thermal management assembly similar to that shown in FIG. 2.

The thermal management assembly exhibits good thermal conductivity. In on embodiment, the thermal management assembly has a through-plane thermal conductivity of from about 200 W/m-K to about 1200 W/m-K; from about 400 W/m-K to about 1100 W/m-K; from about 500 W/m-K to about 1000 W/m-K; even from about 600 W/m-K to about 800 W/m-K. The thermal management assembly can have a relatively low thermal interface resistance. In one embodiment, the thermal management assembly has a thermal interface resistance of less than $10 \times 10^{-6}$ K-m$^2$/W; less than $8 \times 10^{-6}$ K-m$^2$/W; less than $5 \times 10^{-6}$ K-m$^2$/W; less than $2 \times 10^{-6}$ K-m$^2$/W; less than $1 \times 10^{-6}$ K-m$^2$/W; less than $0.5 \times 10^{-6}$ K-m$^2$/W; even less than $0.1 \times 10^{-6}$ K-m$^2$/W. In one embodiment, the thermal management assembly has a thermal interface resistance of from about $0.1 \times 10^{-6}$ K-m$^2$/W to about $1 \times 10^{-6}$ K-m$^2$/W; from about $0.2 \times 10^{-6}$ K-m$^2$/W to about $0.8 \times 10^{-6}$ K-m$^2$/W; even from about $0.3 \times 10^{-6}$ K-m$^2$/W to about $0.6 \times 10^{-6}$ K-m$^2$/W. Here as elsewhere in the specification and claims, numerical values can be combined to form new and non-disclosed ranges.

A thermal management assembly can be formed by disposing a bulk graphene core material between two substrate layers and joining the substrate layers via the metal-based coating material. The metal-based coating material can be applied to opposing surfaces of the bulk graphene material, and the substrate material can be disposed on the surfaces of the bulk graphene comprising the metal-based coating material, the assembly can be subjected to joining under vacuum at a temperature above the melting temperature of the metal-based coating material and below the melting temperature of the core or the substrates.

As described above, the present invention provides a thermal management assembly with good thermal conductivity and, in one embodiment, a low thermal interface resistance. Due to the differences in electronic and vibrational properties in different materials, when an energy carrier attempts to traverse the interface, it scatters at the interface. For thermal management assemblies comprising layers formed from different thermal management materials a poor thermal interface can contribute to interface scattering. Theoretically the thermal resistance through multiple layers can be presented as:

$$R = \sum_i R_i = \sum_i \frac{t_i}{k_i}$$

where t is the thickness of individual layer and k is the corresponding thermal conductivity.

A poor interface can add a significant resistance to the heat flow and, thus, offset or even override the benefit of using the high thermal conductivity materials such as bulk graphene. For example, for assemblies formed by other processes such as conventional diffusion or brazing, the interface between bulk graphene and Cu showed high resistance due to lack of reaction and diffusion, which can result in an overall thermal conductivity lower than that of Cu.

Common methods of joining dissimilar materials include mechanical fastening, adhesive bonding, welding, solid state joining, brazing and soldering. Mechanical fastening inevitably leaves a thin gap between the two materials, which is a significant thermal barrier to the heat flow and, therefore, is considered the worst type of joining for heat conduction. Fluid adhesive before curing can fill up the spaces at the interface, but its polymer heritage determines its low thermal conductivity (typically less than 10 W/m-K), which is far less than most of the metals. Welding of high temperature materials is difficult, such as joining W or Mo, and sometimes is impossible when ceramics or graphite is involved. Solid state joining includes diffusion bonding, which was developed for bonding bulk graphene with various metals in the past. As discussed in the previous paragraphs, the diffusion bonding process exhibits issues of high complexity, high cost, application difficulty to ceramics and high temperature metals, and high interface resistance. Brazing and soldering, on the other hand, rely on a molten filler metal to wet the mating surfaces of a joint, leading to the formation of metallurgical bonds. The metallic property of the brazing/soldering bond provides the continuity of high concentration of energy carriers (electrons), and, thus, renders a highly thermal conductive bond which can be referred to herein as a "thermal bond". Typical brazing or soldering fillers at molten format, however, do not wet bulk graphene and do not spread freely to fill the gaps between bulk graphene and substrates. Such assemblies still exhibit relatively high thermal interface resistance due to the thermal barrier between bulk graphene and braze or solder.

On the other hand, the inventors have found that bulk graphene heat spreaders employing a metal-based interlayer between the core and the substrates with an agent that is reactive with graphene to form a carbide layer can provide an interface layer that bonds the core to the substrate and exhibits extremely low interface thermal resistance.

The thermal management assembly can be sized and shape as desired for a particular purpose or intended use. The thermal management assembly can be used in an apparatus to aid in the thermal management of the apparatus. The thermal management assembly can be disposed adjacent a heat generating component in an apparatus and can dissipate the heat from heat generating component. The thermal management assembly can be used in devices in electronics such as computers, semiconductors, or any device where heat transfer between components is needed. In one embodiment, the electronic component includes a semiconductor chip as a heat producing component. In such a case, the heat producing component can be a chip carrier, an area array package, a chip scale package, or other semiconductor packaging structure. In other embodiments the semiconductor chip itself is the heat producing component. The hot device can be any hot device including, but not limited to, light emitting diodes, laser diodes, power amplifiers, MMIC's, IGBT's, etc.

EXAMPLES

The invention will now be described and may be further understood with respect to the following examples. The examples are intended to be illustrative only and are to be understood as not limiting the invention disclosed herein in any way as to materials, or process parameters, equipment or conditions.

Composites are formed comprising two copper (Cu) substrates and a bulk graphene board disposed between the two metal layers. In the Examples, the bulk graphene material was thermal pyrolytic graphite. The bulk graphene board is oriented perpendicular to the Cu substrates so that the high thermal conductive path of the bulk graphene is aligned with the heat flow that comes through the layered structure. Ag—Cu with Ti additives is used to join the Cu and the bulk graphene at 850° C. under vacuum. The prepared samples have a construction similar to the embodiment depicted in FIG. 2. The thickness of the bulk graphene ranged from 37% to 87% of the total thickness of the composite.

The thermal conductivity of the composites is evaluated by Netzsch NanoFlash LFA 447. For a layered structure free of interface thermal resistance, the overall thermal conductivity of the bulk graphene composite can be calculated as:

$$k_c = \frac{1}{V_m/k_m + V_g/k_g}$$

where, $k_c$, $k_m$, $k_g$ are the thermal conductivity of composite, encapsulation material, and bulk graphene, respectively; and $V_m$, $V_g$ are the volume (thickness) percentage of the substrate and bulk graphene, respectively. FIG. 3 shows that the measured through-plane thermal conductivity with various bulk graphene loading matches the calculated value, indicating an excellent thermal bond between Cu and bulk graphene by employing the metal-based interlayer with the activating agent.

The thermal resistance can be estimated by comparing the difference between the theoretical and experimental thermal conductivity, according to the following formula:

$$R_{int} = \frac{t_{total}}{k_{experimental}} - \frac{t_{total}}{k_{theoretical}}$$

where k is the thermal conductivity and t is the total thickness.

Figure 4:
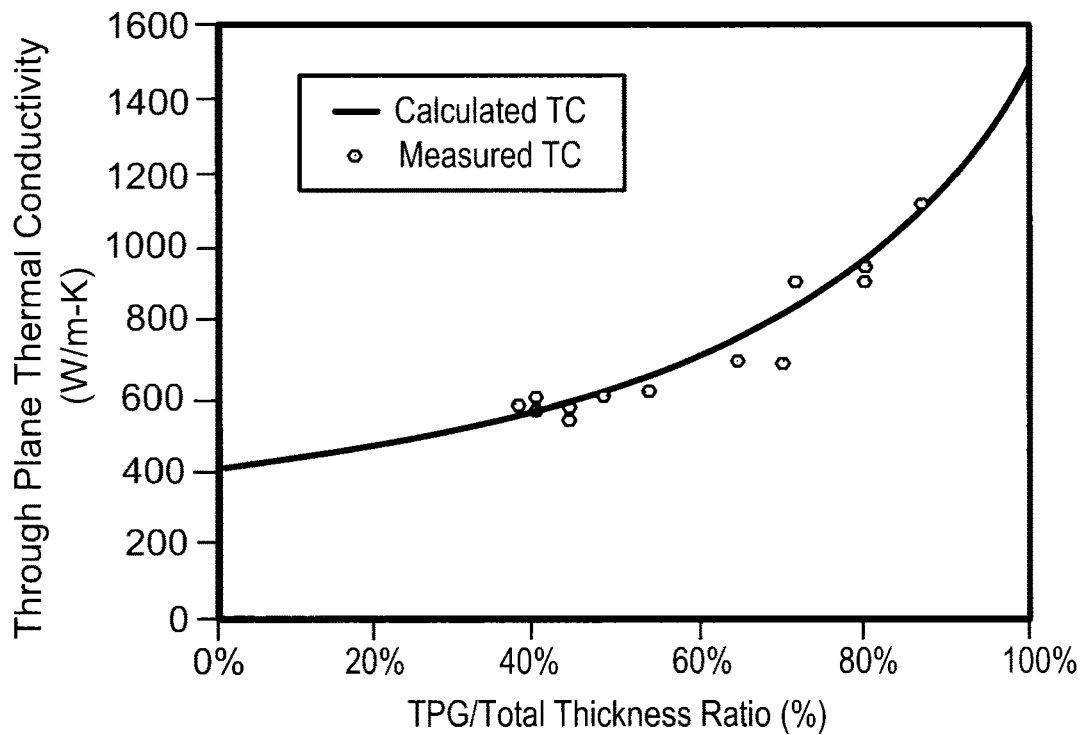
FIG. 4 is a graph illustrating the through plane thermal conductivity of a thermal management assembly in accordance with an embodiment of the invention.
Figure 5:
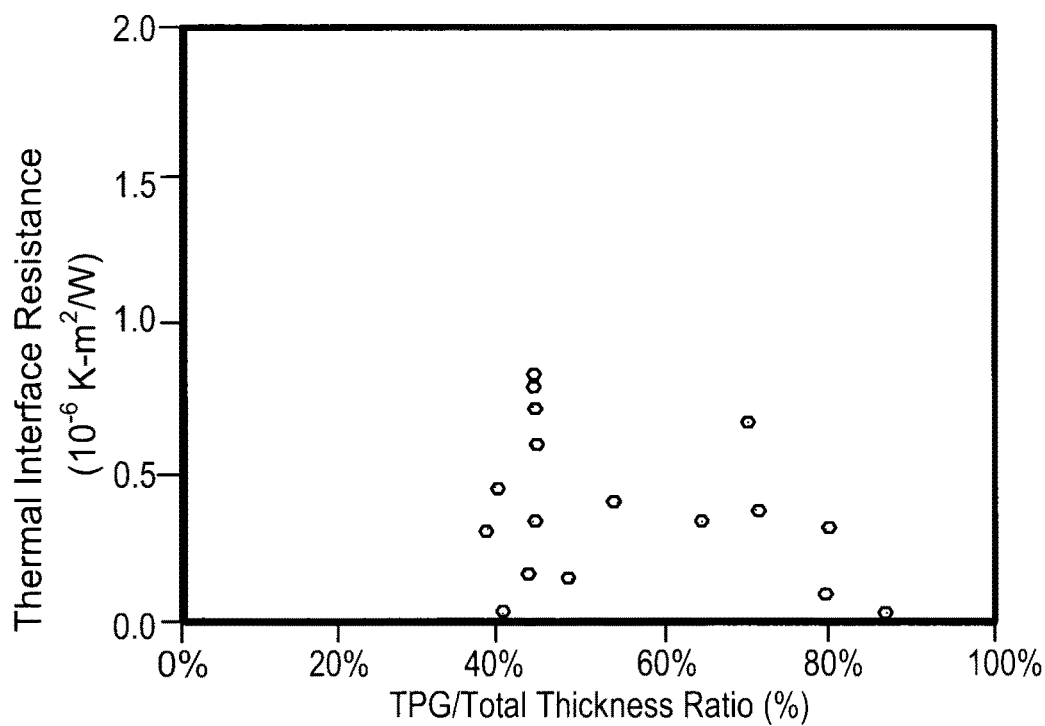
FIG. 5 is a graph illustrating the thermal interface resistance of a thermal management assembly in accordance with the an embodiment of the present invention at different bulk graphene loadings.

FIG. 4-5 illustrates the thermal resistance of the composites formed according to aspects of the present invention. As shown in FIG. 4, the present invention can provide composites with extremely low thermal resistance in the range of $10^{-7}$ K-m$^2$/W, and that the resistance is independent of the amount of bulk graphene loading.

Figure 6:
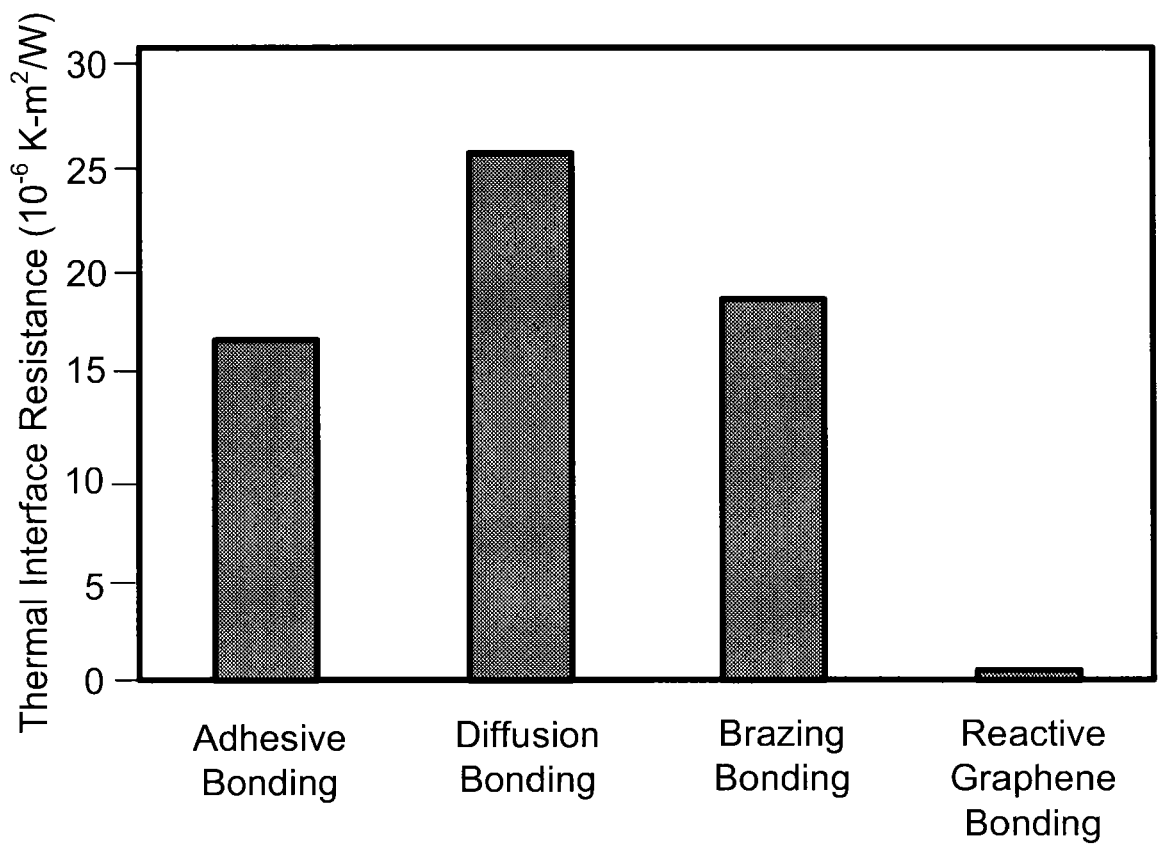
FIG. 6 is a graph illustrating the thermal resistance of thermal management assemblies formed by different manufacturing methods.

Cu/bulk graphene/Cu samples are also prepared via adhesive bonding, diffusion bonding, and conventional brazing. FIG. 6 compares the thermal resistance of these composites to those in accordance with aspects of the invention, and illustrates that the comparative composites have a thermal resistance at least an order of magnitude higher than the composites formed in accordance with aspects of the present invention.

The foregoing description identifies various, non-limiting embodiments of a thermal management assembly. Modifications may occur to those skilled in the art and to those who may make and use the invention. The disclosed embodiments are merely for illustrative purposes and not intended to limit the scope of the invention or the subject matter set forth in the claims.

What is claimed is:

1. A thermal management assembly comprising:
   a first substrate;
   a second substrate;
   a bulk graphene material disposed between the first and second substrates, the bulk graphene material selected from pyrolytic graphite, thermal pyrolytic graphite, highly oriented pyrolytic graphite, compression annealed pyrolytic graphite, or a combination of two or more thereof; and
   (a) a first thermal bond layer directly bonding a first surface of the bulk graphene material and the first substrate, and (b) a second thermal bond layer directly bonding a second surface of the bulk graphene material and the second substrate, the first and second thermal bond layers each comprising (i) a metal-based material wherein the metal-based material is independently chosen from silver, tin, lead, silver-copper, nickel or combinations of two or more thereof and (ii) an agent that is reactive with the bulk graphene material to form a carbide wherein the agent is chosen from titanium, zirconium, chromium, hafnium, aluminum, tantalum, iron, silicon, or a combination of two or more thereof, wherein the first and second thermal bond layers are each a single layer and wherein the first and second thermal bond layers independently have a thermal conductivity of about 20 W/m-K or greater, and a melting temperature less than the melting temperature of the substrates and less than the melting temperature of the bulk graphene material.

2. The thermal management assembly of claim 1, wherein the bulk graphene material comprises at least 3000 graphene layers, the graphene layers being parallel to each other at an angle of at most 1 degree per mm in thickness.

3. The thermal management assembly of claim 2, wherein the bulk graphene material exhibits an in-plane thermal conductivity at least of 1000 W/m-K.

4. The thermal management assembly of claim 2, wherein the bulk graphene material exhibits an in-plane thermal conductivity from about 1000 W/m-K to about 1800 W/m-K.

5. The thermal management assembly of claim 1, wherein the thermal bond layers have a composition different from the composition of the first substrate and the second substrate.

6. The thermal management assembly of claim 1, wherein the first substrate and the second substrate independently comprise a metal or a ceramic material.

7. The thermal management assembly of claim 1, wherein the first substrate and the second substrate independently comprise copper, aluminum, tungsten, molybdenum, nickel, iron, tin, silver, gold, beryllium, or alloys of two or more thereof.

8. The thermal management assembly of claim 1, wherein the first substrate and the second substrate independently comprise silicon nitride, silicon carbide, aluminum nitride, aluminum oxide, beryllium oxide, boron nitride, or a combination of two or more thereof.

9. The thermal management assembly of claim 1, wherein the first substrate comprises copper, aluminum, tungsten, molybdenum, nickel, iron, tin, silver, gold, beryllium, or alloys of two or more thereof, and the second substrate comprises silicon nitride, silicon carbide, aluminum nitride, aluminum oxide, beryllium oxide, boron nitride, or a combination of two or more thereof.

10. The thermal management assembly of claim 1, wherein the bulk graphene material has a thickness from about 25% to about 95% of the total thickness of the thermal management assembly.

11. The thermal management assembly of claim 1, wherein the bulk graphene material has a thickness from about 35% to about 90% of the total thickness of the thermal management assembly.

12. The thermal management assembly of claim 1, wherein the bulk graphene material comprises at least 3000 of graphene layers, and the bulk graphene material is disposed in the assembly such that the graphene layers are oriented perpendicular to the first and second substrates.

13. The thermal management assembly of claim 12, having a through-plane thermal conductivity of from about 200 W/m-K to about 1200 W/m-K.

14. The thermal management assembly of claim 1, wherein the thermal bond has a thermal resistance of less than 10×10-6 K-m2/W.

15. The thermal management assembly of claim 1, wherein the thermal bond has a thermal resistance of less than 5×10-6 K-m2/W.

16. The thermal management assembly of claim 1, wherein the thermal bond has a thermal resistance of less than 1×10-6 K-m2/W.

17. The thermal management assembly of claim 1, wherein the thermal bond has a thermal resistance of less than 0.5×10-6 K-m2/W.

18. The thermal management assembly of claim 1, wherein the thermal bond has a thermal resistance of less than 0.1×10-6 K-m2/W.

19. An apparatus comprising a heat generating component and the thermal management assembly of claim 1 disposed adjacent the heat generating component such that heat from the heat generating component can be transferred through the thermal management assembly.

* * * * *